US012302503B2

United States Patent
Inagaki et al.

(10) Patent No.: US 12,302,503 B2
(45) Date of Patent: May 13, 2025

(54) COMPONENT MOUNTING SYSTEM

(71) Applicant: FUJI CORPORATION, Chiryu (JP)

(72) Inventors: Mitsutaka Inagaki, Anjo (JP); Shigeto Oyama, Kariya (JP); Haruna Narita, Higashiura-cho (JP)

(73) Assignee: FUJI CORPORATION, Chiryu (JP)

( * ) Notice: Subject to any disclaimer, the term of this patent is extended or adjusted under 35 U.S.C. 154(b) by 511 days.

(21) Appl. No.: 17/624,203

(22) PCT Filed: Jul. 4, 2019

(86) PCT No.: PCT/JP2019/026654
§ 371 (c)(1),
(2) Date: Dec. 30, 2021

(87) PCT Pub. No.: WO2021/001995
PCT Pub. Date: Jan. 7, 2021

(65) Prior Publication Data
US 2022/0408622 A1 Dec. 22, 2022

(51) Int. Cl.
*H05K 13/08* (2006.01)
(52) U.S. Cl.
CPC .... *H05K 13/0815* (2018.08); *Y10T 29/53174* (2015.01)
(58) Field of Classification Search
CPC .......... H05K 13/0812; H05K 13/0815; H05K 13/0818; H05K 13/083; H05K 13/084;
(Continued)

(56) References Cited

U.S. PATENT DOCUMENTS

| 6,603,882 B2 * | 8/2003 | Oh | G06T 7/0002 |
| | | | 382/240 |
| 2003/0086616 A1 * | 5/2003 | Oh | G06V 10/7515 |
| | | | 382/209 |

(Continued)

FOREIGN PATENT DOCUMENTS

| JP | 2018-25481 A | 2/2018 |
| JP | 2018-97731 A | 6/2018 |
| WO | WO 2018/087932 A1 | 5/2018 |

OTHER PUBLICATIONS

International Search Report mailed on Sep. 24, 2019 in PCT/JP2019/026654 filed on Jul. 4, 2019, 4 pages.

*Primary Examiner* — Aneeta Yodichkas
*Assistant Examiner* — Joshua D Anderson
(74) *Attorney, Agent, or Firm* — Oblon, McClelland, Maier & Neustadt, L.L.P.

(57) ABSTRACT

A component mounting system includes multiple component mounting devices lined up in a board conveyance direction, with each component mounting device having an imaging device to capture an image of a board. The component mounting system includes a learning device, an inspection device, and a memory device. The learning device captures a post-component-mounting board image after component mounting, acquires training data based on the captured post-component-mounting board image, and creates learning data using machine learning based on the acquired training data. The inspection device captures a post-component-mounting board image, and performs an inspection of the post-component-mounting board under a first inspection condition or under a second inspection condition having inspection accuracy inferior to that of the first inspection condition by performing component recognition image processing on the captured post-component-mounting board image using the learning data.

3 Claims, 10 Drawing Sheets

(58) Field of Classification Search
CPC ........... Y10T 29/4913; Y10T 29/49131; Y10T 29/53174; G06T 2207/30141; G01N 2021/95638; G05B 2219/45026
See application file for complete search history.

(56) References Cited

U.S. PATENT DOCUMENTS

| | | | | |
|---|---|---|---|---|
| 2004/0208353 | A1* | 10/2004 | Murakami | G01N 21/956 |
| | | | | 382/145 |
| 2010/0027873 | A1* | 2/2010 | Kakuda | G01N 21/95684 |
| | | | | 382/147 |
| 2012/0020545 | A1* | 1/2012 | Oike | H05K 13/0815 |
| | | | | 382/141 |
| 2016/0227683 | A1* | 8/2016 | Nakajima | H05K 13/08 |
| 2017/0069057 | A1* | 3/2017 | Kotani | H05K 13/081 |
| 2018/0049356 | A1 | 2/2018 | Mori et al. | |
| 2019/0195939 | A1* | 6/2019 | Noh | G01R 31/28 |
| 2019/0200494 | A1* | 6/2019 | Kim | B41F 33/0045 |
| 2019/0274238 | A1 | 9/2019 | Sugiyama et al. | |
| 2020/0193635 | A1* | 6/2020 | Su | G06T 7/74 |
| 2021/0042910 | A1* | 2/2021 | Lee | H05K 13/0815 |

\* cited by examiner

COMPONENT MOUNTING SYSTEM

TECHNICAL FIELD

This specification discloses a component mounting system.

BACKGROUND ART

Previously proposed component mounting systems have been equipped with a component mounting line provided with one or more component mounting devices, an external inspection device, located on the board unloading side of the component mounting line, to judge the mounting condition of a component mounted on a board, and a learning computer, connected to the component mounting line network, to collect and learn training data for use in a learning process (an example is described in Patent Reference 1). The control device of each component mounting device has a reconstruction-type super-resolution processing section that estimates a high-resolution image based on a low-resolution image of a target image captured during production, and a training-type super-resolution processing section to use learning results from the learning computer to estimate a high-resolution image based on a low-resolution image of a component captured during production. Until the learning process of the learning computer is complete, the control devices of the component mounting device execute reconstruction-type super-resolution processing to estimate high-resolution images, and process the estimated high-resolution images to recognize components. Once the learning process of the learning computer is complete, the control devices of the component mounting device switch to training-type super-resolution processing to estimate high-resolution images, and process the estimated high-resolution images to recognize components. During training-type super-resolution processing, if the control device of the component mounting device determines that training data learning results require updating, the control device switches to reconstruction-type super-resolution processing to estimate high-resolution images, and sends a learning result update request to the learning computer. Once the learning computer that received the update request has re-collected training data, relearned, updated training data with the learning result, and terminated the learning process, the control device of the component mounting device switches from reconstruction-type super-resolution processing to training-type super-resolution processing.

CITATION LIST

Patent References

Patent Reference 1: JP-A-2018-97731

BRIEF SUMMARY

Technical Problem

When a component mounting system inspects a post-component-mounting board by capturing a post-component-mounting board image after mounting and performing component recognition image processing on the captured image, a potential method to improve production efficiency is to perform inspection under inspection conditions with inferior inspection accuracy, such as under a condition in which training data has not been sufficiently collected. Because performing an inspection under inspection conditions with inferior inspection accuracy can create problems with the quality of boards on which components have been mounted, a method of ensuring the quality of boards on which components have been mounted even under such conditions is desirable.

A main purpose of this disclosure is to allow inspection under inspection conditions with inferior inspection accuracy while also ensuring the quality of boards on which a component has been mounted when the board on which a component has been mounted is inspected by processing post-component-mounting board images using learning data created using machine learning based on training data.

Solution to Problem

This disclosure employs the following means to achieve the main purpose described above.

A first component mounting system in this disclosure is
  a component mounting system equipped with multiple component mounting devices lined up in a board conveyance direction, with each component mounting device having an imaging device to capture an image of a board, the component mounting system provided with:
a learning device configured to capture a post-component-mounting board image after component mounting, acquire training data based on the captured post-component-mounting board image, and create learning data using machine learning based on the acquired training data;
an inspection device configured to capture a post-component-mounting board image, perform an inspection of the post-component-mounting board under a first inspection condition or under a second inspection condition having inspection accuracy inferior to that of the first inspection condition by performing component recognition image processing on the captured post-component-mounting board image using the learning data; and
a memory device configured to, when inspection of a post-component-mounting board is performed under the second inspection condition, the captured post-component-mounting board image with inspection information indicating that inspection was performed under the second inspection condition and identifying information which identifies the post-component-mounting board, and record the captured post-component-mounting board image.

A first component mounting system in this disclosure is provided with a learning device, an inspection device, and a memory device. The learning device captures a post-component-mounting board image, acquires training data based on the captured image, and uses machine learning based on the acquired training data to create learning data. The inspection device captures a post-component-mounting board image, and performs an inspection of the post-component-mounting board under a first inspection condition or under a second inspection condition having inspection accuracy inferior to that of the first inspection condition by performing component recognition image processing on the captured post-component-mounting board image using learning data. When inspection of a post-component-mounting board is performed under the second inspection condition, the memory device links inspection information indicating that inspection was performed under the second inspection condition with identifying information which identifies the post-component-mounting board, and records the captured post-component-mounting board image. This enables an operator to later review captured post-component-mounting board images and judge the suitability of the inspection result from the inspection device in the event that post-component-mounting board inspection has been performed under the less-accurate second inspection condition. This makes it possible to ensure the quality of post-component-mounting boards.

A second component mounting system in this disclosure is a component mounting system equipped with multiple component mounting devices which are lined up in a board conveyance direction and which are each provided with an imaging device to capture a board image, the second component mounting system having multiple component mounting devices consisting of an upstream component mounting device located upstream in a board conveyance direction, a downstream component mounting device located downstream in a board conveyance direction, and one or more intermediate component mounting devices located between the upstream component mounting device and the downstream component mounting device, and wherein the upstream component mounting device mounts a lower component on a board and the downstream component mounting device mounts an upper component on top of the lower component mounted on the board, and which is provided with:

a learning device which uses an imaging device provided on the upstream component mounting device or on a component mounting device located farther upstream in a board conveyance direction than the upstream component mounting device to capture a pre-lower-component-mounting board image before lower component mounting, uses an imaging device provided on the upstream component mounting device or on one of the intermediate component mounting devices to capture a post-lower-component-mounting board image after lower component mounting, performs machine learning based on the captured pre-lower-component-mounting board image, acquires training data based on the captured post-lower-component-mounting board image, performs machine learning based on the acquired training data and captured post-lower-component-mounting board image, and creates learning data for lower component inspection; and an inspection device that inspects a post-lower-component-mounting board by capturing a post-lower-component-mounting board image using an imaging device provided on the upstream component mounting device or one of the intermediate component mounting devices and using learning data for lower component inspection to perform component recognition image processing on the captured post-lower-component-mounting board image.

The second component mounting system in this disclosure is provided with multiple component mounting devices which are arranged in a board conveyance direction and which are each provided with an imaging device. The multiple component mounting devices consist of an upstream component mounting device, a downstream component mounting device, and one or more intermediate component mounting devices located between an upstream component mounting device and a downstream component mounting device, and wherein an upstream component mounting device mounts a lower component on a board and a downstream component mounting device mounts an upper component on top of a lower component mounted on the board. The second component mounting system is further provided with a learning device and an inspection device. The learning device uses an imaging device provided on the upstream component mounting device or on a component mounting device located farther upstream in a board conveyance direction than the upstream component mounting device to capture a pre-lower-component-mounting board image, and uses an imaging device provided on the upstream component mounting device or on one of the intermediate component mounting devices to capture a post-lower-component-mounting board image. The learning device then performs machine learning based on the captured pre-lower-component-mounting board image, acquires training data based on the captured post-lower-component-mounting board image, performs machine learning based on the acquired training data and captured post-lower-component-mounting board image, and creates learning data for lower component inspection. The inspection device inspects a post-lower-component-mounting board after lower component mounting by capturing a post-lower-component-mounting board image using an imaging device provided on the upstream component mounting device or one of the intermediate component mounting devices and using learning data for lower component inspection to perform component recognition image processing on the captured post-lower-component-mounting board image. Compared to the method of capturing a post-lower-component-mounting board image using a downstream component mounting device and acquiring training data based on the captured image, this method enables post-lower-component-mounting board learning data to be created at an earlier stage, thereby enabling post-lower-component-mounting inspection based on learning data to be performed at an earlier stage.

Figure 1:
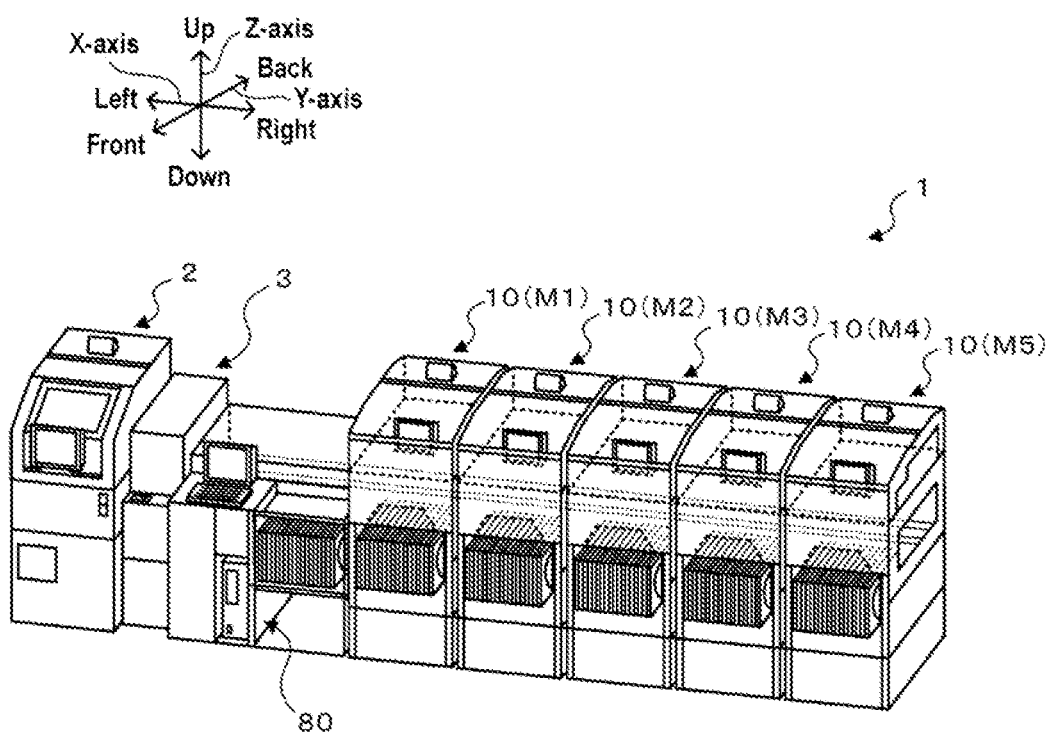
FIG. 1

This is a diagram showing an overview of the configuration of component mounting system 1 of an embodiment.

FIG. 2

This is an external perspective view of component mounting device 10.

FIG. 3

This is an explanatory drawing showing the electrical connections between control device 60 of component mounting device 10 and management device 80.

FIG. 4

This is an explanatory drawing describing the multiple component mounting devices 10 (M1 to M5) that make up the production line, as well as the processes performed by each of the multiple component mounting devices 10 (M1 to M5).

FIG. 5

This is a flowchart showing an example of the lower component mounting process.

FIG. 6

This is a flowchart showing an example of the upper component mounting process.

FIG. 7

This is a flowchart showing an example of the learning process for lower component inspection.

FIG. 8

This is a flowchart showing an example of the lower component inspection process.

FIG. 9

This is a flowchart showing an example of the learning process for upper component inspections.

FIG. 10

This is a flowchart showing an example of the upper component inspection process.

FIG. 11

This is a flowchart showing an example of image processing of a board after lower component mounting.

DESCRIPTION OF EMBODIMENTS

Embodiments of the present disclosure are described below with reference to the figures.

Figure 2:
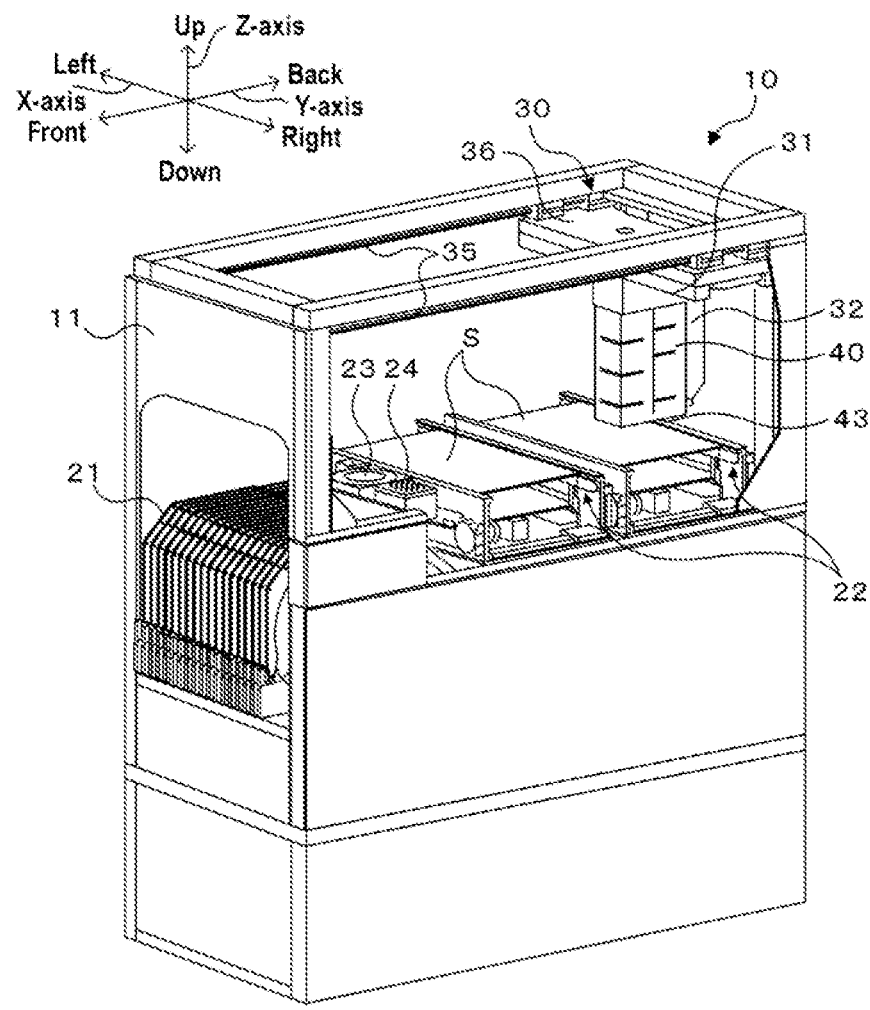
Figure 3:
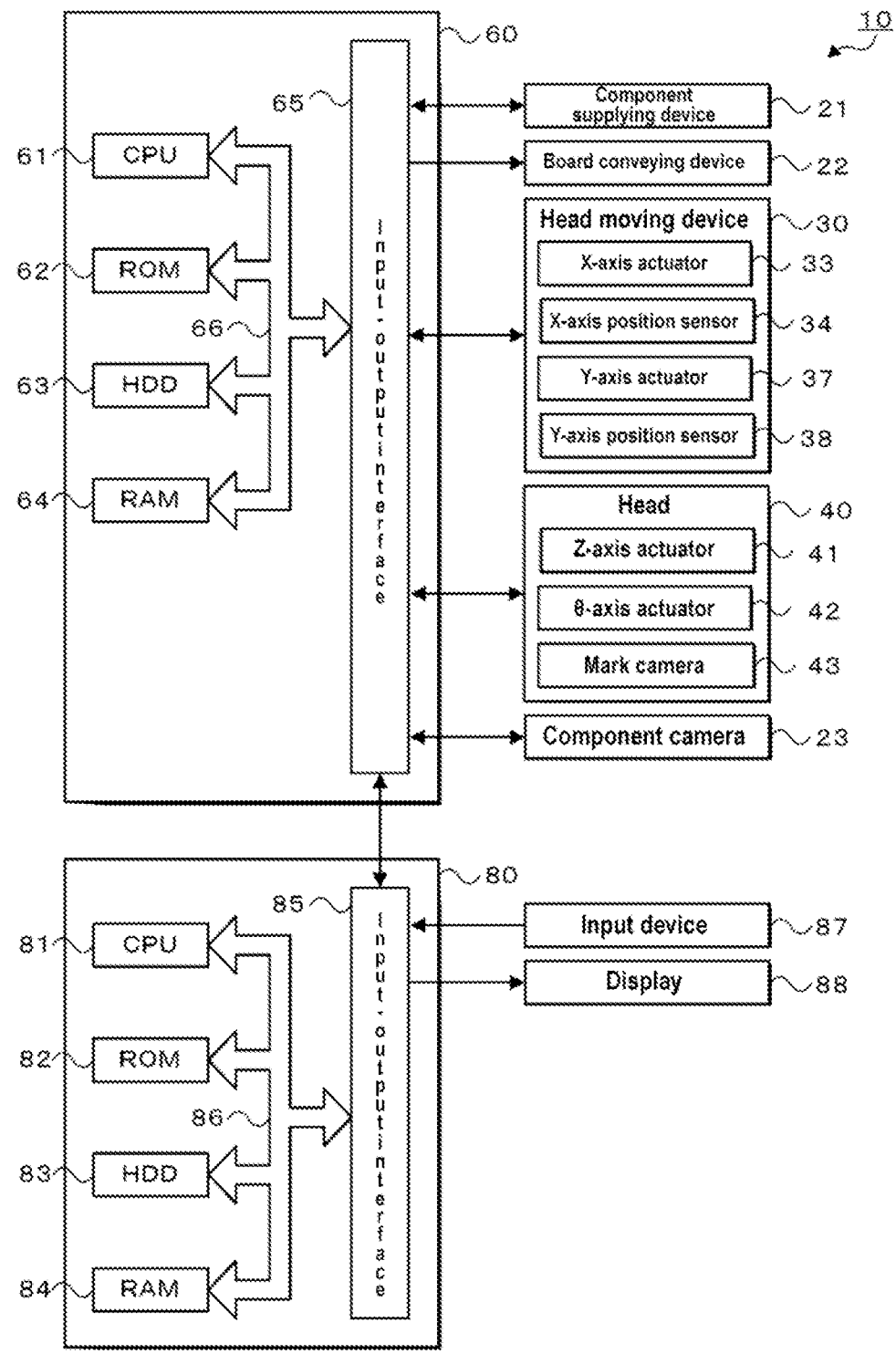

FIG. 1 is a diagram showing an overview of the configuration of component mounting system 1 of this embodiment. FIG. 2 is an external perspective view of component mounting device 10. FIG. 3 is an explanatory drawing showing the electrical connections between control device 60 of component mounting device 10 and management device 80. Note that in FIGS. 1 and 2, the left-right direction is the X-axis direction, the front-rear direction is the Y-axis direction, and the up-down direction is the Z-axis direction.

As shown in FIG. 1, component mounting system 1 is equipped with printer 2, printer inspection device 3, multiple (for example, five) component mounting devices 10 (M1 to M5), and management device 80 to perform overall system management. Printer 2 prints solder and forms circuit patterns on board S. Print inspection device 3 inspects the condition of solder printed by printer 2. Multiple component mounting devices 10 perform mounting operations to mount a component on board S and perform a mounting inspection to determine whether a component was mounted on board S. Printer 2, print inspection device 3, and multiple component mounting devices 10 are lined up in a board S conveyance direction, forming a production line.

As shown in FIG. 2, component mounting device 10 is equipped with component supply device 21 to supply components, board conveyance device 22 to convey board S, head 40 with suction nozzle to pick up components, head moving device 30 to move head 40 in the X-axis and Y-axis directions, and control device 60 to perform overall control of the mounting device (see FIG. 3). Component mounting device 10 is further equipped with devices such as component camera 23 to capture images of the pickup attitude of components picked up by the suction nozzle, nozzle station 24 to store a replacement suction nozzle, and mark camera 43 to capture an image of board S.

Component supply device 21 consists of, for example, a tape reel around which is wound carrier tape containing components at a given distance from each other, and a tape feeder from which carrier tape is fed from the tape reel as far as the component supply position, the feed driven by a drive motor. Component supply device 21 (tape feeder) is removably attached to a feeder base, which is not shown in the drawing, provided on component mounting device 10.

Board conveyance device 22 is provided with a pair of conveyor rails positioned so as to leave a gap between the two rails in the Y-axis direction. The pair of conveyor rails are driven to convey board S in the direction from left to right in FIG. 1 (a board conveyance direction).

As shown in FIG. 2, head moving device 30 is provided with pair of X-axis guide rails 31, X-axis slider 32, and X-axis actuator 33 (shown in FIG. 3), as well as pair of Y-axis guide rails 35, Y-axis slider 36, and Y-axis actuator 37 (shown in FIG. 3). Pair of Y-axis guide rails 35 is installed at the top level of machine enclosure 11 in such a way that the guide rails are parallel to each other and extend in the Y-axis direction. Y-axis slider 36 straddles pair of Y-axis guide rails 35, and is driven by Y-axis actuator 37 to move in the Y-axis direction along Y-axis guide rails 35. Pair of X-axis guide rails 31 is installed on the lower surface of Y-axis slider 36 in such a way that the guide rails are parallel to each other and extend in the X-axis direction. X-axis slider 32 straddles pair of X-axis guide rails 31, and is driven by X-axis actuator 33 to move in the X-axis direction along X-axis guide rails 31. Head 40 is attached to X-axis slider 32, and head moving device 30 moves X-axis slider 32 and Y-axis slider 36 to move head 40 in the X and Y directions.

Head 40 is provided with Z-axis actuator 41 (shown in FIG. 3) to move a suction nozzle in the Z-axis (up-down) direction, and θ-axis actuator 42 (shown in FIG. 3) to rotate the suction nozzle around the Z-axis. Head 40 connects the suction port of the suction nozzle to a source of negative pressure and conducts negative pressure to the suction port, enabling the suction port to pick up components. Head 40 further connects the suction port of the suction nozzle to a source of positive pressure and conducts positive pressure to the suction port, enabling the suction port to release components.

As shown in FIG. 3, control device 60 is configured as a microprocessor having CPU 61 as its primary device, control device 60 being further provided with ROM 62, HDD 63, RAM 64, and input-output interface 65. These devices are connected electrically via bus 66. Position signals from X-axis position sensor 34 detecting X-axis slider 32 position, position signals from Y-axis position sensor 38 detecting Y-axis slider 36 position, image signals from mark camera 43, and image signals from component camera 23 are received as input by control device 60 through input-output device 65. In the other direction, control signals to component supply device 21, control signals to board conveyance device 22, drive signals to X-axis actuator 33, drive signals to Y-axis actuator 37, drive signals to Z-axis actuator 41, drive signals to θ-axis actuator 42, control signals to component camera 23, and control signals to mark camera 43 from control device 60, are output from control device 60 through input-output device 65. Control device 60 is connected to management device 80 in a way that allows bidirectional communication, and data and control signals are exchanged between these devices.

As shown in FIG. 3, management device 80 can consist of a general-purpose computer provided with devices such as CPU 81, ROM 82, HDD 83 (or SSD), RAM 84, and input-output interface 85. These devices are connected electrically by bus 86. Input signals from input device 87, which can consist of devices such as mice and keyboards, are received as input by management device 80 through input-output interface 85. Image signals are output from management device 80 to display 88 through input-output interface 85. HDD 83 stores board S production jobs in memory. Board S production jobs contain production schedules which define the types and order of components to be mounted on board S by each component mounting device 10, and the number of boards S on which components have been mounted will be produced. Management device 80 commands each component mounting device 10 to begin production by creating production jobs based on data entered by an operator through input device 87, and transmitting the created production jobs to each component mounting device 10.

Figure 4:
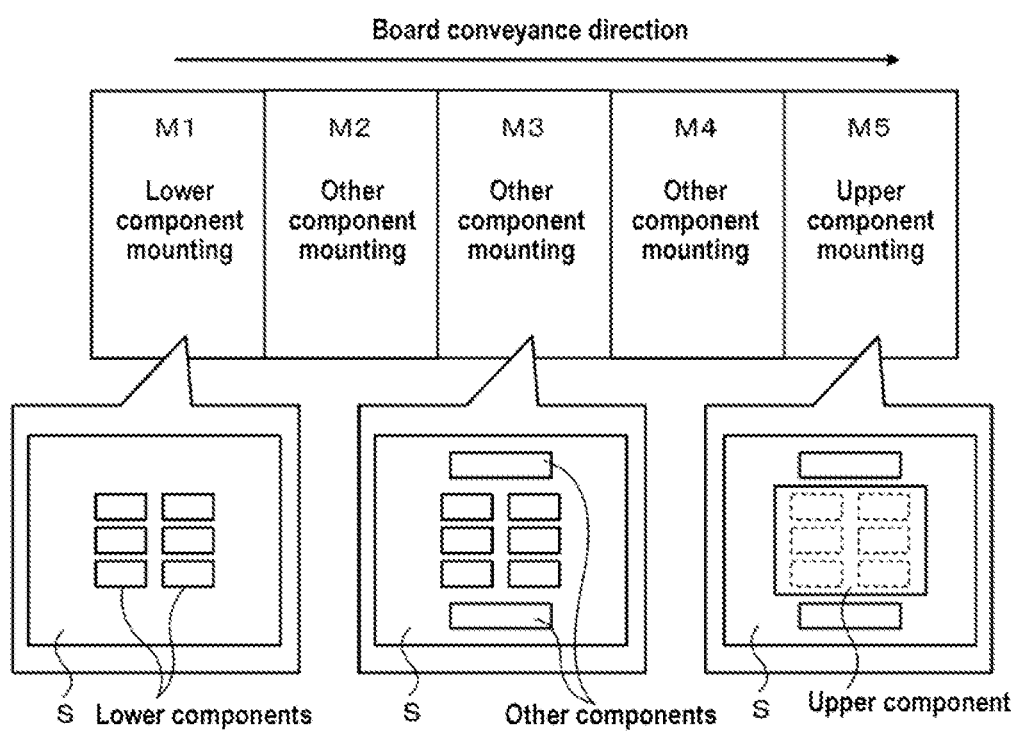

The processes performed by this configuration of component mounting device 10 of component mounting system 1 of this embodiment are described below. Described in detail are the various mounting inspections of upper and lower components which are performed when lower components are mounted on board S and upper components (frame components) are mounted on top of the mounted lower components. FIG. 4 is an explanatory drawing describing the multiple component mounting devices 10 (M1 to M5) making up the production line, and the operation processes performed by each of the multiple component mounting devices 10 (M1 to M5). In the present embodiment, as shown in the drawing, component mounting device M1, which is furthest upstream in a board conveyance direction among the multiple component mounting devices (M1 to M5), mounts the lower components, and component mounting device M5, which is furthest downstream in a board conveyance direction, mounts the upper components. Component mounting devices (intermediate component mounting devices) M2 to M4, which are located between component mounting device M1, which is furthest upstream, and component mounting device M5, which is furthest downstream, mount other components which are not covered by upper components (frame components).

The mounting process for lower components performed by component mounting device M1 and the mounting process for upper components performed by component mounting device M5 are described below.

Figure 5:
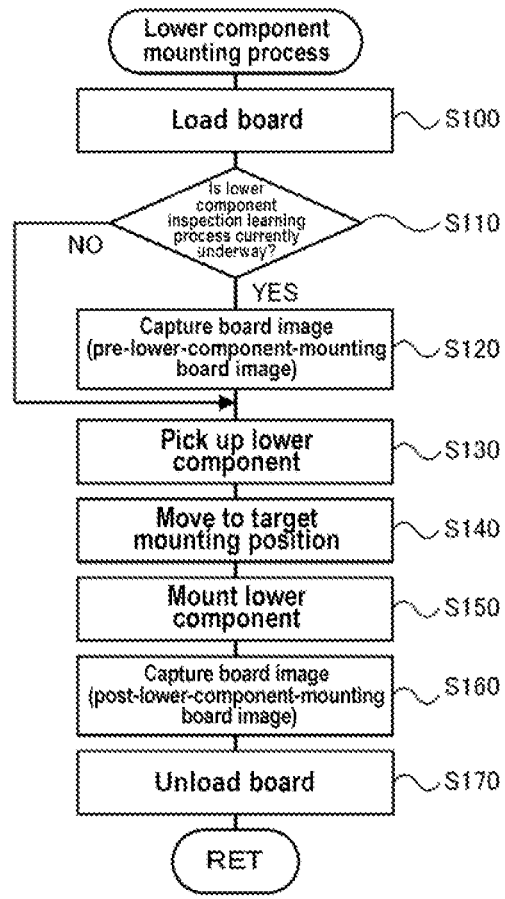

FIG. 5 is a flowchart showing an example of the lower component mounting process. This process is executed by control device 60 of component mounting device M1, which is the component mounting device furthest upstream. In the lower component mounting process, CPU 61 of control device 60 of component mounting device M1 first controls board conveyance device 22 to load board S (Step S100). Then, CPU 61 judges whether the learning process to be used for the mounting inspection of lower components (learning process for lower component inspection) described below is in progress (Step S110); if CPU 61 judges that the learning process for lower component inspection is in progress, CPU 61 controls head moving device 30 so that mark camera 43 comes above the loaded board S, controls mark camera 43 to capture an image of board S (Step S120), and then proceeds to Step S130. This enables the capture of an image of board S before lower components are mounted (pre-lower-component-mounting board image). If CPU 61 judges that the learning process for lower component inspection is not in progress (learning is complete), it skips Step S120 and proceeds to Step S130.

Next, CPU 61 executes a pickup process which controls head moving device 30 to move the suction nozzle to a position above the component supply position of component supply device 21, and controls head 40 to pick up a lower component with the suction nozzle (Step S130). CPU 61 then executes a mounting process which controls head moving device 30 to move the picked-up lower component to a position above the target mounting position on board S (Step S140), and controls head 40 to mount the lower component in the target mounting position on board S (Step S150). Step S140 executes a process wherein the picked-up lower component is moved so that the lower component passes over component camera 23 and arrives at a position above the target mounting position. CPU 61 captures an image of the picked-up lower component when the lower component passes over component camera 23, and in addition to calculating the amount of shift in pickup position for the lower component based on the acquired image, corrects the target mounting position based on the amount of shift in pickup position that was calculated. When CPU 61 performs this mounting process it controls mark camera 43 to capture an image of board S on which the lower component has been mounted (Step S160). This enables acquisition of an image of board S after lower component mounting (post-lower-component-mounting board image). CPU 61 then controls board conveyance device 22 to unload the board S (Step S170) and terminates this process.

Figure 6:
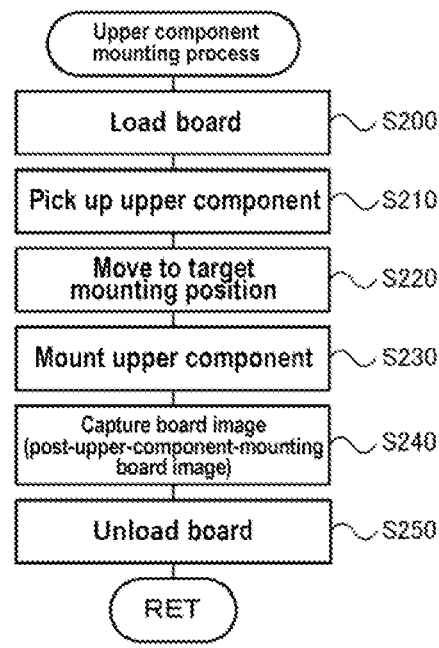

FIG. 6 is a flowchart showing an example of the upper component mounting process. This process is performed by control device 60 of component mounting device M5, which is the component mounting device furthest downstream. In the upper component mounting process, CPU 61 of control device 60 of component mounting device M5 first controls board conveyance device 22 to load board S (Step S200). Next, CPU 61 executes a pickup process which controls head moving device 30 to move the suction nozzle to a position above the component supply position of component supply device 21, and controls head 40 to pick up an upper component with the suction nozzle (Step S210). CPU 61 then executes a mounting process which controls head moving device 30 to move the picked-up upper component to a position above the target mounting position on board S (Step S220), and controls head 40 to mount the upper component in the target mounting position on board S (Step S230). Step S220 executes a process wherein the picked-up upper component is moved so that the upper component passes over component camera 23 and arrives at a position above the target mounting position. CPU 61 captures an image of the picked-up upper component when the upper component passes over component camera 23, and in addition to calculating the amount of shift in pickup position for the upper component based on the acquired image, corrects the target mounting position based on the amount of shift in pickup position that was calculated. When CPU 61 performs this mounting process it controls mark camera 43 to capture an image of board S on which the upper component has been mounted (Step S240). This enables acquisition of an image of board S after upper component mounting (post-upper-component-mounting board image). In the upper component mounting process, an image of board S before upper component mounting is not captured. The reason for this is described later. CPU 61 then controls board conveyance device 22 to unload board S (Step S250) and terminates this process.

Figure 7:
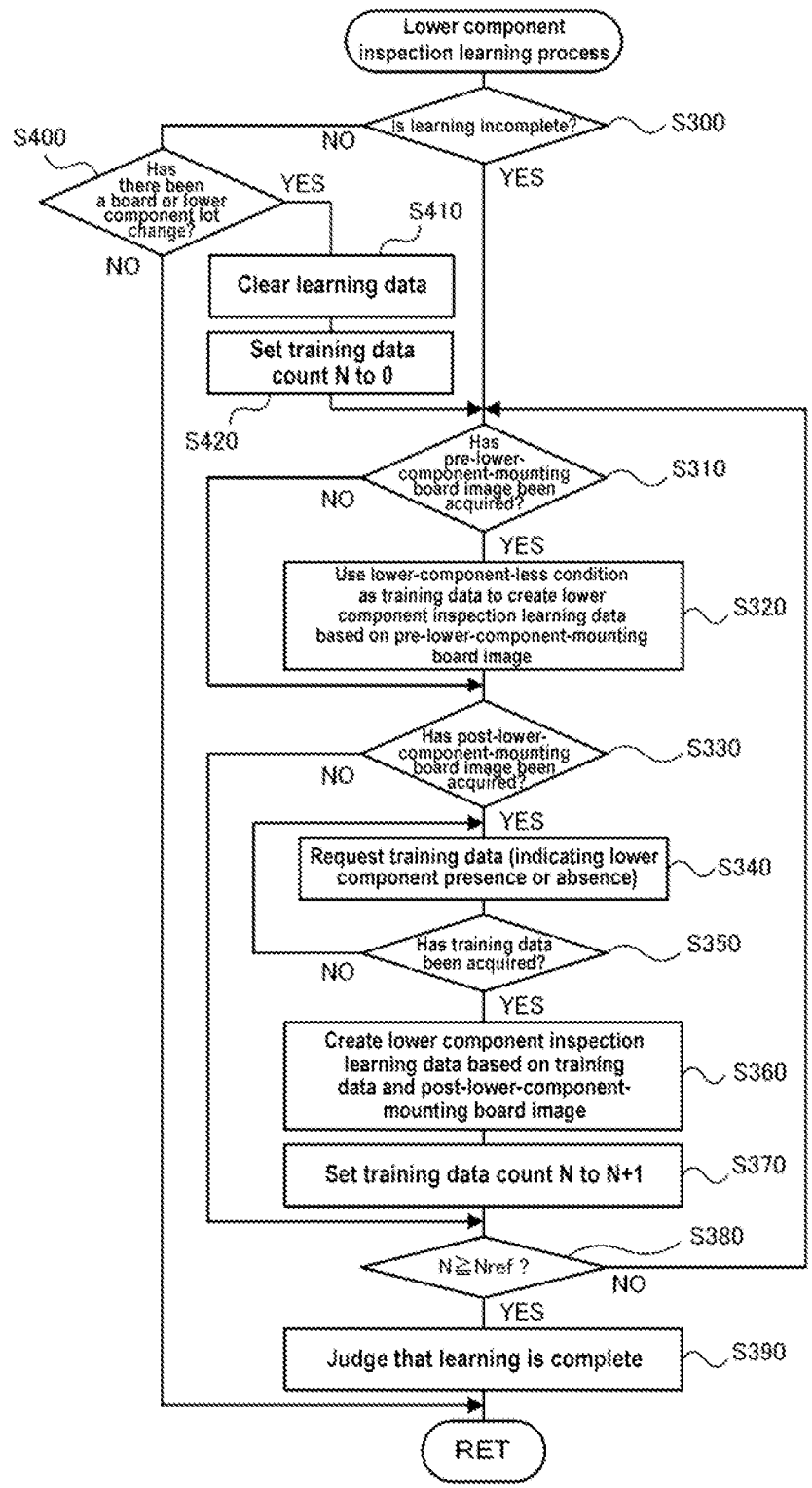

The learning process for lower component inspection, which creates learning data for use in lower component mounting inspection, is described below. FIG. 7 is a flowchart showing an example of the learning process for lower component inspection. This process is repeatedly performed by CPU 81 of management device 80 at given time intervals while the lower component mounting process is being performed by component mounting device M1. When the learning process for lower component inspection is executed, CPU 81 of management device 80 first determines whether learning is complete (Step S300). If CPU 81 judges learning to be incomplete, CPU 81 next determines whether a pre-lower-component-mounting board image has been acquired (Step S310). A pre-lower-component-mounting board image is acquired in Step S120 of the lower component mounting process when mark camera 43 captures an image of board S before lower components are mounted on board S. If CPU 81 judges that a pre-lower-component-mounting board image has been acquired, it uses the component-less state as training data to perform machine learning (such as by using a support vector machine) based on the pre-lower-component-mounting board image to create learning data for lower component inspection (Step S320). Learning data for lower component inspection is created by finding the relationship between a board image and its inspection results by pairing a pre-lower-component-mounting board image as the input and the inspection results (with the board in a component-less state) as the output.

Next, CPU 81 determines whether a post-lower-component-mounting board image has been acquired (Step S330). A post-lower-component-mounting board image is acquired in Step S160 of the lower component mounting process when mark camera 43 captures an image of board S after lower components have been mounted on board S. If CPU 81 determines that a post-lower-component-mounting board image has been acquired, CPU 81 displays the post-lower-component-mounting board image on display 88, requests input of training data indicating component presence or absence (Step S340), and waits for training data to be input (Step S350). An operator determines whether the lower component to be inspected appears in the post-lower-component-mounting board image which is displayed on display 88. If the operator judges that the lower component is shown in the image, the operator enters "Component Present." lithe operator judges that the lower component is not shown in the image, the operator enters "Component Absent." When the operator inputs training data indicating component presence or absence, CPU 81 uses machine learning to create (or update) lower component inspection learning data based on the training data that was input and the post-lower-component-mounting board image (Step S360), and increments the acquired training data count N by a value of 1 (Step S370). Learning data for lower component inspection is created by finding the relationship between a board image and its inspection results by pairing a post-lower-component-mounting board image as the input with the training data (operator entry indicating component presence or absence) as the output.

CPU 81 then determines whether acquired training data count N is equal to or greater than given count Nref (Step S380). Given count Nref is the training data count that has been found to enable sufficient accuracy when performing lower component mounting inspections which use lower component inspection learning data. If CPU 81 determines that acquired training data count N is less than given count Nref, CPU 81 returns to Step S310 and repeats the process of using machine learning to create (update) lower component inspection learning data based on the pre-lower-component-mounting board image and the post-lower-component-mounting board image. If CPU 81, on repeat processing, determines that acquired training data count N in Step S380 is equal to or greater than given count Nref, CPU 81 judges learning to be complete (Step S390) and terminates this process.

If CPU 81 judges that learning is complete in Step S300, CPU 81 then determines whether there has been a lot change in board S or the lower component (Step S400). If CPU 81 judges that there was not a lot change it terminates this process. If CPU 81 judges that there was a lot change, CPU 81 clears the learning history acquired in Steps S320 and S360 (Step S410), changes acquired training data count N to a value of 0 (Step S420), and proceeds to Step S310. In this case learning (relearning) based on pre-lower-component-mounting board image and component-less training data, as well as learning (relearning) based on post-lower-component-mounting board image and training data input by the operator indicating whether the lower component was present when the operator viewed the post-lower-component-mounting board image after lower component mounting, will be repeated and lower component inspection learning data will be recreated until acquired training data count N meets or exceeds given count Nref. The reason learning is repeated if there was a lot change in board S or the lower component is the risk that board S or the lower component may appear different before and after a lot change.

CPU 81 links lot information of board S with a board ID that identifies board S, and records lot information for board S in HDD 83 in advance; when board S is loaded into component mounting device 10, lot information linked to the board ID of board S is read to determine whether there has been a lot change in board S. If CPU 81 judges that there has been a lot change in board S, learning is performed again, and the lower component inspection learning data created by this re-learning is linked both to identifying information that identifies the learning data (learning ID) and to the board ID, and this link is recorded in HDD 83. CPU 81 links the lower component ID, which identifies the lower component, with the lot information of the lower component, and records the lot information of the lower component in HDD 83 in advance; when the component is mounted on a board S loaded into component mounting device 10, CPU 81 reads the lot information linked to the component ID of the lower component to determine whether there has been a lot change in the lower component. If CPU 81 judges that there has been a lot change in the lower component, learning is performed again, and the lower component inspection learning data created by this re-learning is linked both to the learning ID of this learning data and the board ID, and recorded in HDD 83. The lower component inspection learning data recorded at this time is used the next time a lower component inspection process is executed.

Figure 8:
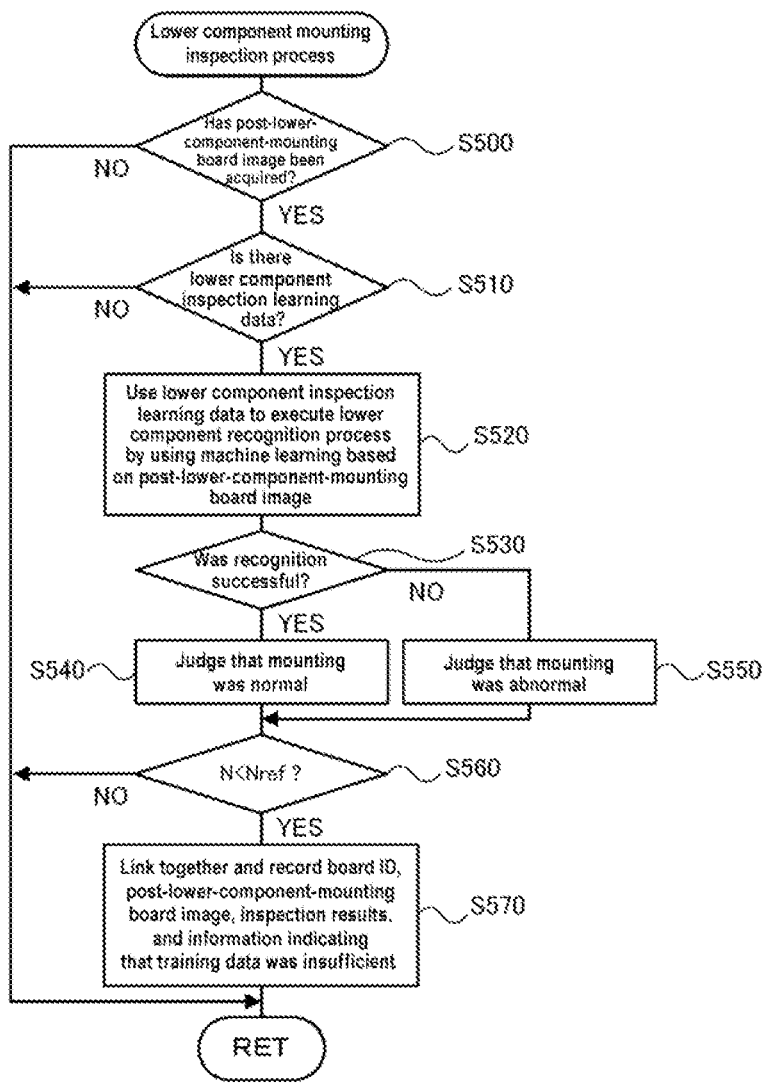

Lower component mounting inspection using lower component inspection learning data is described below. FIG. 8 is a flowchart showing an example of the lower component inspection process performed by CPU 81 of management device 80. This process is performed repeatedly at given time intervals while the lower component mounting process is being performed by component mounting device M1.

When the lower component inspection process is executed, CPU 81 of management device 80 first determines whether the post-lower-component-mounting board image has been acquired (Step S500), and whether lower component inspection learning data exists (Step S510). If CPU 81 judges that the post-lower-component-mounting board image has not been acquired or that lower component inspection learning data does not exist, CPU 81 judges that lower component inspection cannot be performed, and terminates this process. If CPU 81 judges that the post-lower-component-mounting board image has been acquired and that lower component inspection learning data exists, CPU 81 performs a recognition process (using image processing); the recognition process uses the lower component inspection learning data to recognize the lower component in the post-lower-component-mounting board image; this enables CPU 81 to perform a mounting inspection to determine whether the lower component to be inspected has been mounted on board S (Step S520). Identifying information which identifies the board S and lower component to be inspected (board ID and lower component ID) is used to find and read the corresponding lower component inspection learning data from HDD 83; the lower component mounting inspection determines whether the read learning data (recognition model) allows the lower component to be recognized in the post-lower-component-mounting board image. CPU 81 executes a recognition process to judge whether lower component recognition was successful (Step S530); if CPU 81 judges that lower component recognition was successful, CPU 81 judges that lower component mounting was performed correctly (Step S540); if CPU 81 judges that lower component recognition was unsuccessful, CPU 81 judges that a mounting error has occurred (Step S550). CPU 81 then determines whether acquired training data count N is less than given count Nref; in other words, CPU 81 judges whether learning in the lower component inspection learning process is complete (Step S560). If CPU 81 judges that the acquired training data count N is not less than given count Nref but is equal to or greater than given count Nref, CPU 81 terminates this process; if CPU 81 judges that acquired training data count N is less than given count Nref, it links the board ID with the inspection results in Steps S540 and S550 and information indicating that training data is incomplete; CPU 81 then records in HDD 83 the post-lower-component-mounting board image (Step S570) and terminates this process.

In this embodiment, because the only conditions for performing lower component mounting inspection are that the post-lower-component-mounting board image must have been acquired and lower component inspection learning data existing must exist, lower component mounting inspection is still performed even if acquired training data count N of the training data which was used to generate the lower component inspection learning data has not reached given count Nref, or in other words, is still performed even though learning was not completed. This enables faster lower component mounting inspection and higher production efficiency. However, mounting inspection performed when acquired training data count N is less than given count Nref (second inspection condition) is less accurate than mounting inspection performed when acquired training data count N is equal to or greater than given count Nref (first inspection condition). For this reason, in this embodiment, if mounting inspection is performed when acquired training data count N is less than given count Nref, the board ID of the board S used in the mounting inspection, the post-lower-component-mounting board image, and the inspection results are linked with this information, which is recorded in HDD 83. This enables an operator to later review a post-lower-component-mounting board image and judge the suitability of the inspection results, thereby ensuring the quality of the board after lower component mounting.

Figure 9:
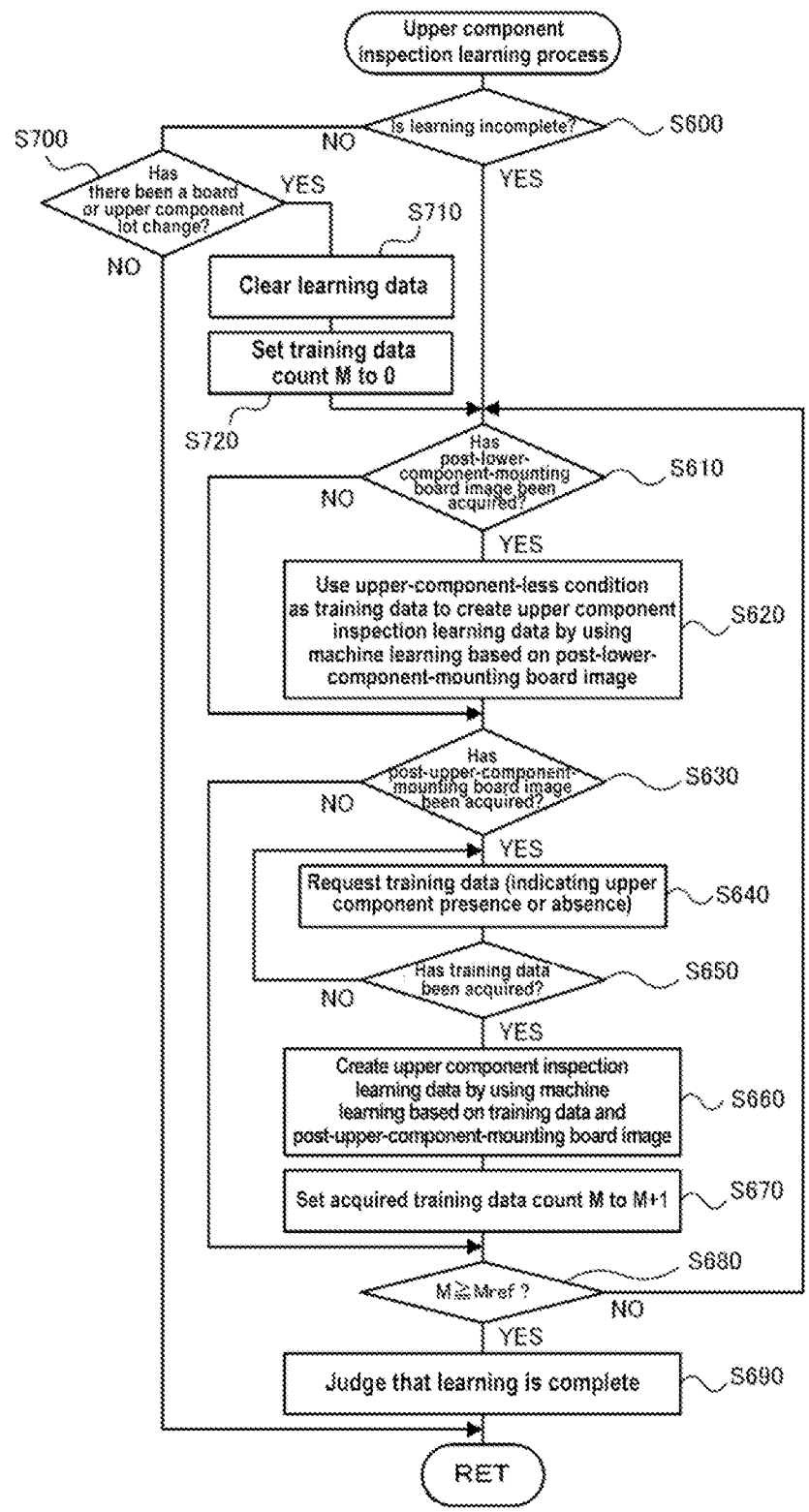

The learning process for upper component inspection, which creates learning data for use in upper component mounting inspection, is described below. FIG. 9 is a flowchart showing an example of the learning process for upper component inspection. This process is repeatedly performed by CPU 81 of management device 80 at given time intervals while the upper component mounting process is being performed by component mounting device M5. When the learning process for upper component inspection is executed, CPU 81 of management device 80 first determines whether learning is complete (Step S600). If CPU 81 judges learning to be incomplete, CPU 81 next determines whether a post-lower-component-mounting board image has been acquired (Step S610). In this embodiment, a post-lower-component-mounting board image is acquired in Step S160 of the lower component mounting process when mark camera 43 captures an image of board S after lower components are mounted on board 5; this captured image of board S before upper components are mounted is used as the pre-upper-component-mounting board image. This enables omitting the process wherein an image of board S is captured by mark camera 43 before upper component mounting during the upper component mounting process. Of course, the pre-upper-component-mounting board image can also be acquired by capturing an image of board S before mounting upper components, during the upper component mounting process. If CPU 81 judges that a post-lower-component-mounting board image (pre-upper-component-mounting board image) has been acquired, it uses the component-less state as training data to perform machine learning (such as by using a support vector machine) based on the post-lower-component-mounting board image (pre-upper-component-mounting board image) to create learning data for upper component inspection (Step S620). Learning data for upper component inspection is created by finding the relationship between a board image and its inspection results by pairing a pre-upper-component-mounting board image as the input with the inspection results (with the board in a component-less state) as the output.

Next, CPU 81 determines whether a post-upper-component-mounting board image has been acquired (Step S630). A post-upper-component-mounting board image is acquired in Step S240 of the upper component mounting process when mark camera 43 captures an image of board S after upper components have been mounted on board S. If CPU 81 determines that a post-upper-component-mounting board image has been acquired, CPU 81 displays the post-upper-component-mounting board image on display 88, requests input of training data indicating component presence or absence (Step S640), and waits for training data to be input (Step S650). An operator determines whether the upper component to be inspected appears in the post-upper-component-mounting board image which is displayed on display 88; if the operator judges that the upper component is shown in the image, the operator enters "Component Present"; if the operator judges that the upper component is not shown in the image, the operator enters "Component Absent". When the operator inputs training data indicating component presence or absence, CPU 81 uses machine learning to create (or update) upper component inspection learning data based on the training data that was input and the post-upper-component-mounting board image (Step S660), and increments the acquired training data count M by a value of 1 (Step S670). Learning data for upper component inspection is created by finding the relationship between a board image and its inspection results by pairing a post-upper-component-mounting board image as the input with the training data (operator entry indicating component presence or absence) of the inspection results as the output.

CPU 81 then determines whether acquired training data count N is equal to or greater than given count Mref (Step S680). Given count Mref is the training data count that has been found to enable sufficient accuracy when performing upper component mounting inspection using upper component inspection learning data. If CPU 81 determines that acquired training data count M is less than given count Mref, CPU 81 returns to Step S610 and repeats the process of using machine learning to create (or update) upper component inspection learning data based on the post-lower-component-mounting board image (pre-upper-component-mounting board image) and the post-upper-component-mounting board image. If CPU 81, on repeat processing, determines in Step S680 that acquired training data count M is equal to or greater than given count Mref, CPU 81 judges learning to be complete (Step S690) and terminates this process.

If CPU 81 judges that learning is complete in Step S600, CPU 81 then determines whether there has been a lot change in board S or the upper component (Step S700). If CPU 81 judges that there was not a lot change it terminates this process. If CPU 81 judges that there was a lot change, CPU 81 clears the learning history acquired in Steps S620 and S660 (Step S710), changes acquired training data count M to a value of 0 (Step S720), and proceeds to Step S610. In this case learning (or relearning) based on the pre-upper-component-mounting board image and component-less training data, as well as learning (or relearning) based on the post-upper-component-mounting board image and training data input by the operator indicating whether the upper component was present when the operator viewed the post-upper-component-mounting board image, will be repeated and upper component inspection learning data recreated until acquired training data count M meets or exceeds given count Mref. The reason learning is repeated if there was a lot change in board S or the upper component is the risk that board S or the upper component may appear different before and after a lot change.

CPU 81 links lot information for board S with a board ID that identifies board S, and records lot information for board S in HDD 83 in advance; when board S is loaded into component mounting device 10, lot information linked to the board ID of board S is read to determine whether there has been a lot change in board S. If CPU 81 judges that there has been a lot change in board S, learning is performed again, and the upper component inspection learning data created by this re-learning is linked both to identifying information that identifies the learning data (learning ID) and to the board ID, and this link is recorded in HDD 83. CPU 81 links the upper component ID, which identifies the upper component, with the lot information of the upper component, and records the lot information of the upper component in HDD 83 in advance; when the component is mounted on a board S loaded into component mounting device 10, CPU 81 reads the lot information linked to the component ID of the upper component to determine whether there has been a lot change in the upper component. If CPU 81 judges that there has been a lot change in the upper component, learning is performed again, and the upper component inspection learning data created by this re-learning is linked both to the learning ID of this learning data and the board ID, and recorded in HDD 83. The upper component inspection learning data recorded at this time is used the next time an upper component inspection process is executed.

Figure 10:
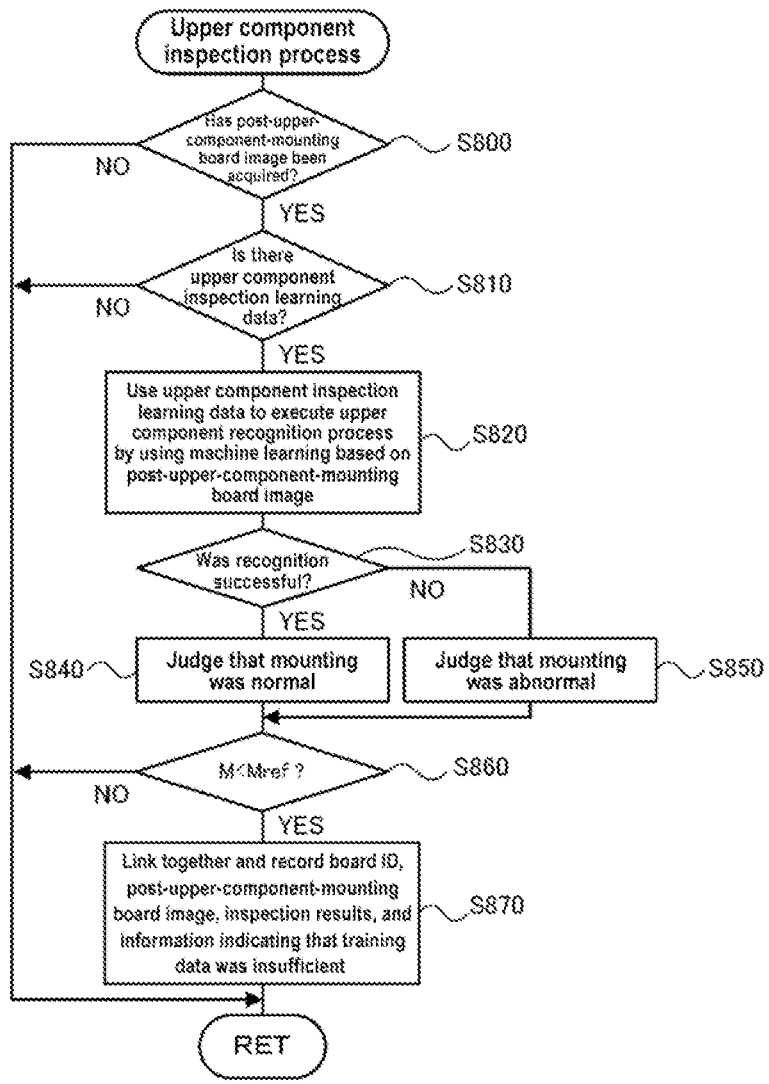

Upper component mounting inspection using upper component inspection learning data is described below. FIG. 10 is a flowchart showing an example of the upper component inspection process performed by CPU 81 of management device 80. This process is performed repeatedly at given time intervals while the upper component mounting process is being performed by component mounting device M5.

When the upper component inspection process is executed, CPU 81 of management device 80 first determines whether the post-upper-component-mounting board image has been acquired (Step S800), and whether upper component inspection learning data exists (Step S810). If CPU 81 judges that the post-upper-component-mounting board image has not been acquired or that upper component inspection learning data does not exist, CPU 81 judges that upper component inspection cannot be performed, and terminates this process. If CPU 81 judges that the post-upper-component-mounting board image has been acquired and that upper component inspection learning data exists, CPU 81 performs a recognition process (using image processing); the recognition process uses the upper component inspection learning data to recognize the upper component in the post-upper-component-mounting board image; this enables CPU 81 to perform a mounting inspection to determine whether the upper component to be inspected has been mounted on board S (Step S820). Identifying information which identifies the board S and upper component to be inspected (board ID and upper component ID) is used to find and read the corresponding upper component inspection learning data from HDD 83; the upper component mounting inspection determines whether the read learning data (recognition model) allows the upper component to be recognized in the post-upper-component-mounting board image, the upper component mounting inspection may either be performed or not performed. CPU 81 executes a recognition process to judge whether upper component recognition was successful (Step S830); if CPU 81 judges that upper component recognition was successful, CPU 81 judges that upper component mounting was performed correctly (Step S840); if CPU 81 judges that upper component recognition was unsuccessful, CPU 81 judges that a mounting error has occurred (Step S850). CPU 81 then determines whether acquired training data count M is less than given count Mref; in other words, CPU 81 judges whether learning in the upper component inspection learning process is complete (Step S860). If CPU 81 judges that acquired training data count M is not less than given count Mref but is equal to or greater than given count Mref, CPU 81 terminates this process; if CPU 81 judges that acquired training data count M is less than given count Mref, it links the board ID with the inspection results in Steps S840 and S850 and information indicating that training data is incomplete; CPU 81 then records in HDD 83 the post-upper-component-mounting board image (Step S870) and terminates this process.

In this embodiment, because the only conditions for performing upper component mounting inspection are that the post-upper-component-mounting board image must have been acquired and upper component inspection learning data must exist, upper component mounting inspection is still performed even if acquired training data count M of the training data which was used to create the upper component inspection learning data has not reached given count Mref; in other words, inspection is still performed even though learning was not completed. This enables faster upper component mounting inspection and higher production efficiency. However, mounting inspection performed when acquired training data count M is less than given count Mref (second inspection condition) is less accurate than mounting inspection performed when acquired training data count M is equal to or greater than given count Mref (first inspection condition). For this reason, in this embodiment, if mounting inspection is performed when acquired training data count M is less than given count Mref, the board ID of the board S used in the mounting inspection, the post-upper-component-mounting board image, and the inspection results are linked with this information, which is recorded in HDD 83. This enables an operator to later review the post-upper-component-mounting board image and judge the suitability of the inspection results, thereby ensuring the quality of the board after upper component mounting.

The correspondence between the main elements of the embodiment and the main elements of the disclosure is described below. Mark camera 43 corresponds to the imaging device; component mounting device 10 corresponds to the component mounting device; component mounting system 1 corresponds to the component mounting system; CPU 81 of the management device 80 which executes the learning process for lower component inspection and the learning process for upper component inspection corresponds to the learning device; CPU 81 of the management device 80 which executes the lower component inspection process and the upper component inspection process corresponds to the inspection device; and HDD 83 of management device 80 corresponds to the memory device. Component mounting device M1 corresponds to the upstream component mounting device; component mounting device M5 corresponds to the downstream component mounting device; and component mounting devices M2 to M4 correspond to the intermediate component mounting devices.

This disclosure is not limited in any way to the embodiments described above, and can be implemented in various ways as long as it falls within the technical scope of the disclosure of this disclosure.

Figure 11:
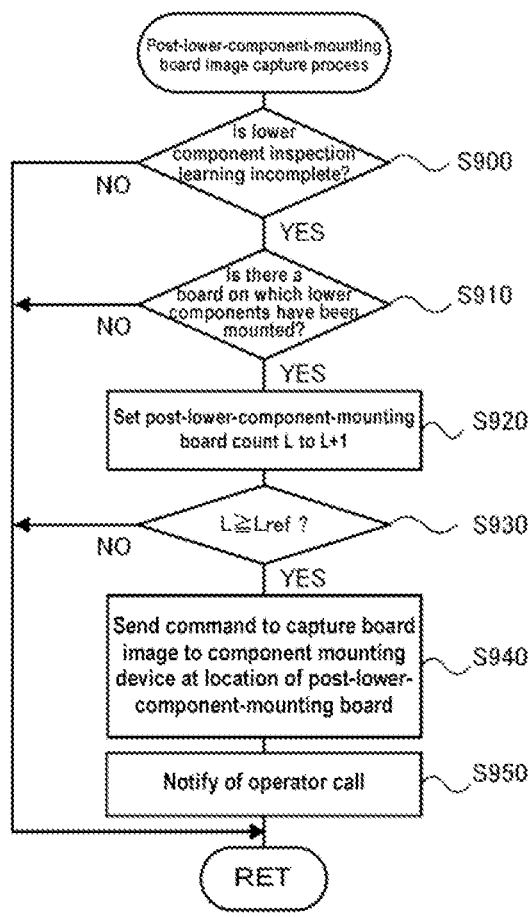

For example, in this embodiment, the post-lower-component-mounting board image is captured by mark camera 43 of component mounting device M1 immediately after lower components are mounted by component mounting device M1. However, in component mounting system 1 provided with one or more component mounting devices M2 to M4 between component mounting device M1, which mounts upper components, and component mounting device M5, which mounts lower components, it is acceptable to configure the system to wait for post-lower-component-mounting boards to be carried in to at least two of the component mounting devices from M1 to M4, which are located further upstream in a board conveyance direction than component mounting device M5, before using the mark cameras 43 of the at least two component mounting devices to simultaneously capture images of multiple post-lower-component-mounting boards. FIG. 11 is a flowchart showing an example of post-lower-component-mounting board image processing performed by CPU 81 of management device 80. In post-lower-component-mounting board image processing, CPU 81 of management device 80 first judges whether learning for lower component mounting inspection is incomplete (Step S900), and then judges whether there are any boards on which lower components have already been mounted, or in other words whether component mounting device M1 has mounted lower components (Step S910). If CPU 81 judges that learning is complete, or judges that there are no boards on which lower components have already been mounted, it terminates this process. If CPU 81 judges that learning is incomplete and that there is a board on which a lower component has already been mounted, CPU 81 increments count L of post-lower-component-mounting boards by a value of 1 (Step S920), and determines whether post-lower-component-mounting board count L is equal to or greater than given Lref (Step S930). Given count Lref is the count of post-lower-component-mounting boards for which image will be simultaneously captured; for example, if images of post-lower-component-mounting boards will be captured at three component mounting devices (intermediate component mounting devices) M2 to M4, in addition to component mounting device M1 which will mount the lower components, this value is 4. If CPU 81 judges that the count of post-lower-component-mounting boards L is less than given count Lref, CPU judges that image capture timing criteria are not met, and terminates this process; if CPU 81 judges that the count of post-lower-component-mounting boards L is equal to or greater than given count Lref, CPU 81 issues individual commands to every component mounting device M1 to M4 to which a post-lower-component-mounting board has been loaded in, causing mark camera 43 of that component mounting device to capture an image of the post-lower-component-mounting board (Step S940); CPU 81 then issues an operator call notifying the operator that post-lower-component-mounting board images have been captured (Step S950), and terminates this process (Step S950). This enables the operator to confirm multiple post-lower-component-mounting board images at once, which allows more efficient input of training data into management device 80. This enables a reduction in operator workload.

In the embodiment, in the lower component inspection learning process, in addition to learning based on post-lower-component-mounting board images and training data entered by operators viewing the post-lower-component-mounting board images and indicating whether components are present, CPU 81 also performs learning based on pre-lower-component-mounting board images and component-less training data; however, the learning based on pre-lower-component-mounting board images and component-less training data can also be omitted.

In the embodiment, in the upper component inspection learning process, in addition to learning based on post-upper-component-mounting board images and training data entered by operators viewing the post-upper-component-mounting board images and indicating whether components are present, CPU 81 also performs learning based on pre-upper-component-mounting board images (post-lower-component-mounting board images) and component-less training data; however, the learning based on pre-upper-component-mounting board images (post-lower-component-mounting board images) and component-less training data can also be omitted.

In the embodiment, in the lower component inspection process and upper component inspection process, CPU 81 performs inspection using learning data by inspecting whether components were mounted on boards S after the mounting operation. It is also acceptable if CPU 81 performs inspection using learning data by inspecting whether component mounting positions were shifted versus board S. (Shifts can be in the X or Y directions, or in the rotational direction.)

In the embodiment, in component mounting system 1, component mounting device M1 captures images of a pre-lower-component-mounting board and post-lower-component-mounting board as it mounts a lower component, and component mounting device M5 captures images of a post-upper-component-mounting board as it mounts an upper component on a lower component. In component mounting systems provided with a component mounting device further upstream in a board conveyance direction than component mounting device M1, pre-lower-component-mounting board images can be captured by using the mark camera (imaging device) provided in the upstream component mounting device. Capture of post-lower-component-mounting board images can also be performed by a mark camera (imaging device) provided in component mounting devices M2 to M4 which are further downstream in a board conveyance direction than component mounting device M1 which mounts lower components and further upstream in a board conveyance direction than component mounting device M5, which mounts upper components. In a component mounting system provided with a component mounting device further downstream in a board conveyance direction than component mounting device M5, the capture of post-upper-component-mounting board images can be performed by the mark camera (imaging device) provided on the downstream component mounting device.

The first component mounting system of this disclosure is a component mounting system equipped with multiple component mounting devices which are lined up in a board conveyance direction and which are each provided with an imaging device to capture a board image, the first component mounting system provided with: a learning device which captures a post-component-mounting board image after the component mounting operation is performed, acquires training data based on the captured post-component-mounting board image, and creates learning data using machine learning based on the acquired training data; an inspection device which captures a post-component-mounting board image and performs an inspection of the post-component-mounting board under a first inspection condition or under a second inspection condition having inspection accuracy inferior to that of the first inspection condition by performing component recognition image processing on the captured post-component-mounting board image using the learning data; and a memory device which, when inspection of a post-component-mounting board inspection is performed under the second inspection condition, links the captured post-component-mounting board image with inspection information indicating that inspection was performed under the second inspection condition and identifying information which identifies the post-component-mounting board, and records the captured post-component-mounting board image.

The first component mounting system of this disclosure is provided with a learning device, an inspection device, and a memory device. The learning device captures a post-component-mounting board image, acquires training data based on the captured image, and uses machine learning based on the acquired training data to create learning data. The inspection device captures a post-component-mounting board image, and performs an inspection of the post-component-mounting board under a first inspection condition or under a second inspection condition having inspection accuracy inferior to that of the first inspection condition by performing component recognition image processing on the captured post-component-mounting board image using learning data. When inspection of a post-component-mounting board is performed under the second inspection condition, the memory device links the captured post-component-mounting board image with inspection information indicating that inspection was performed under the second inspection condition and identifying information which identifies the post-component-mounting board, and records the captured post-component-mounting board image. This enables an operator to later review captured post-component-mounting board images and judge the suitability of the inspection result from the inspection device in the event that post-component-mounting board inspection has been performed under the less-accurate second inspection condition. This makes it possible to ensure the quality of post-component-mounting boards.

In the first component mounting system of this disclosure, the first inspection condition may be a condition in which post-component-mounting board inspection is performed based on learning data generated after a given count of training data has been acquired, and the second inspection condition may be a condition in which post-component-mounting board inspection is performed based on learning data generated before a given count of training data has been acquired. This allows component mounting inspection to be performed even if training data is insufficient, improving production efficiency. When component mounting inspection is performed with insufficient training data, the captured post-component-mounting board image is linked to information indicating this condition when the board image is recorded. This enables an operator to later review the captured post-component-mounting board image and judge the suitability of the inspection result.

The second component mounting system in this disclosure is a component mounting system equipped with multiple component mounting devices which are lined up in a board conveyance direction and which are each provided with an imaging device to capture a board image, the second component mounting system provided with multiple component mounting devices consisting of an upstream component mounting device located upstream in a board conveyance direction, a downstream component mounting device located downstream in a board conveyance direction, and one or more intermediate component mounting devices located between an upstream component mounting device and a downstream component mounting device, and wherein an upstream component mounting device mounts a lower component on a board and a downstream component mounting device mounts an upper component on top of a lower component mounted on the board; a learning device which uses an imaging device provided on the upstream component mounting device or on a component mounting device located farther upstream in a board conveyance direction than the upstream component mounting device to capture a pre-lower-component-mounting board image before a lower component mounting operation is performed, uses an imaging device provided on the upstream component mounting device or on one of the intermediate component mounting devices to capture a post-lower-component-mounting board image after a lower component mounting operation is performed, performs machine learning based on the captured pre-lower-component-mounting board image, acquires training data based on the captured post-lower-component-mounting board image, performs machine learning based on the acquired training data and captured post-lower-component-mounting board image, and creates learning data for lower component inspection; and an inspection device that inspects a post-lower-component-mounting board after lower component mounting by capturing a post-lower-component-mounting board image using an imaging device provided on the upstream component mounting device or one of the intermediate component mounting devices and using the learning data for lower component inspection to perform component recognition image processing on the captured post-lower-component-mounting board image.

The second component mounting system in this disclosure is provided with multiple component mounting devices which are arranged in a board conveyance direction and which are each provided with an imaging device. The multiple component mounting devices consist of an upstream component mounting device, a downstream component mounting device, and one or more intermediate component mounting devices located between an upstream component mounting device and a downstream component mounting device, and wherein an upstream component mounting device mounts a lower component on a board and a downstream component mounting device mounts an upper component on top of a lower component mounted on the board. The second component mounting system is further provided with a learning device and an inspection device. The learning device uses an imaging device provided on the upstream component mounting device or on a component mounting device located farther upstream in a board conveyance direction than the upstream component mounting device to capture a pre-lower-component-mounting board image, and uses an imaging device provided on the upstream component mounting device or on one of the intermediate component mounting devices to capture a post-lower-component-mounting board image. The learning device then performs machine learning based on the captured pre-lowercomponent-mounting board image, acquires training data based on the captured post-lower-component-mounting board image, performs machine learning based on the acquired training data and captured post-lower-component-mounting board image, and creates learning data for lower component inspection. The inspection device inspects a post-lower-component-mounting board after lower component mounting by capturing a post-lower-component-mounting board image using an imaging device provided on the upstream component mounting device or one of the intermediate component mounting devices and using the learning data for lower component inspection to perform component recognition image processing on the captured post-lower-component-mounting board image. Compared to the method of capturing a post-lower-component-mounting board image using a downstream component mounting device and acquiring training data based on the captured image, this method enables post-lower-component-mounting board learning data to be created at an earlier stage, thereby enabling post-lower-component-mounting inspection based on learning data to be performed at an earlier stage.

It is acceptable to configure the second component mounting system of this disclosure so as to await the presence of post-lower-component-mounting boards in each of at least two component mounting devices from among the upstream component mounting device or the intermediate component mounting devices before capturing post-lower-component-mounting board images using the imaging devices of the at least two component mounting devices. This enables an operator to review the captured post-lower-component-mounting board images all at once and more efficiently input training data into the learning device. This enables a reduction in operator workload. In this case it is acceptable to configure the second component mounting system so as to notify an operator when post-lower-component-mounting board images have been captured by each of the imaging devices of the at least two component mounting devices. Such a configuration alerts the operator that multiple post-lower-component-mounting board images have been captured, enabling the operator to quickly review multiple captured images and enter training data into the learning device all at once, which enables the learning device to learn more efficiently.

It is acceptable to configure the second component mounting system of this disclosure so that the learning device performs machine learning using the captured post-lower-component-mounting board image as the pre-upper-component-mounting board image before upper component mounting, captures a post-upper-component-mounting board image after upper component mounting using the imaging device of the downstream component mounting device or a component mounting device located farther downstream than the downstream component mounting device in a board conveyance direction, acquires training data based on the captured post-upper-component-mounting board image, and creates learning data for upper component inspection using machine learning based on the acquired training data; and such that the inspection device captures a post-upper-component-mounting board image using the imaging device of the downstream component mounting device or a component mounting device located farther downstream than the downstream component mounting device in a board conveyance direction, and performs component recognition image processing on the captured post-upper-component-mounting board image using the upper component inspection learning data to inspect the post-upper-component-mounting board. This enables upper component inspection to be performed together with lower component inspection. Because upper component inspection learning uses the captured post-lower-component-mounting image, which is used to acquire the lower component inspection learning data, as the captured pre-upper-component-mounting board image, a pre-upper-component-mounting image can be acquired without the need to perform a separate image capture.

It is further acceptable to configure the second component mounting system of this disclosure so that the learning device recreates learning data for lower component inspection every time there is a change in board or lower component lots by using the imaging device provided on the upstream component mounting device or on one of the intermediate component mounting devices to capture a post-lower-component-mounting board image, reacquiring training data based on the captured post-lower-component-mounting board image, and performing machine learning based on the training data thus reacquired. This enables continuity of good component recognition accuracy even if there is a board or component lot change.

INDUSTRIAL APPLICABILITY

This disclosure can be used in the manufacture of component mounting devices and component mounting systems.

REFERENCE SIGNS LIST

1: component mounting system; 2: printer; 3: print inspection device; 10: component mounting device; 11: machine enclosure; 21: component supply device: 22: board conveyance device; 23: component camera; 24: nozzle station; 30: head moving device; 31: X-axis guide rails; 32: X-axis slider; 33: X-axis actuator; 34: X-axis position sensor; 35: Y-axis guide rails; 36: Y-axis slider; 37: Y-axis actuator; 38: Y-axis position sensor; 40: head; 41: Z-axis actuator, 42: θ-axis actuator; 43: mark camera; 60: control device; 61: CPU; 62: ROM; 63: HDD; 64: RAM; 65: input-output interface; 66: bus; 80: management device; 81: CPU; 82: ROM; 83: HDD; 84: RAM; 85: input-output interface; 86: bus; S: board

The invention claimed is:
1. A component mounting system, the component mounting system comprising:
multiple component mounting devices lined up in a board conveyance direction configured to mount components on boards, with each component mounting device having an imaging device to capture an image of the boards; and
processing circuitry configured to:
capture post-component-mounting board images of the boards after component mounting via the imaging device of one of the component mounting machines,
acquire training data based on the post-component-mounting board images,
increment an acquired training data count when the training data is acquired,
create learning data using machine learning based on the acquired training data;
perform an inspection of a post-component-mounting board by capturing a post-component-mounting board image of the post-component-mounting board and performing component recognition image processing on the post-component-mounting board image using the learning data, set a condition for the inspection of the post-component-mounting board when the inspection of the post-component-mounting board is based on the learning data when the acquired training data count is less than a predetermined count, and only when inspection of the post-component-mounting board is performed under the condition, link in a memory the post-component-mounting board image of the post-component-mounting board with inspection information indicating that inspection was performed under the condition and identifying information which identifies the post-component-mounting board, and record the captured post-component-mounting board image of the post-component-mounting board in the memory.

2. The component mounting system according to claim 1, wherein the acquired training data count is incremented after the training data is acquired when an operator judges a component present or absent on the post-component-mounting board image as the training data.

3. The component mounting system according to claim 1, wherein the predetermined count corresponds to a count in which mounting accuracy is sufficient and learning based on the learning data is judged complete.

* * * * *